(12) United States Patent
Cianciosi

(10) Patent No.: US 6,184,916 B1
(45) Date of Patent: Feb. 6, 2001

(54) MULTIPLE-PULSE, PULSE WIDTH AND POSITION MODULATION SYSTEMS AND METHODS

(75) Inventor: Michael S. Cianciosi, Rochester, NY (US)

(73) Assignee: Xerox Corporation, Stamford, CT (US)

( * ) Notice: Under 35 U.S.C. 154(b), the term of this patent shall be extended for 0 days.

(21) Appl. No.: 09/234,218

(22) Filed: Jan. 19, 1999

(51) Int. Cl.[7] ....................................... B41J 2/47
(52) U.S. Cl. ........................... 347/255; 347/239; 341/53; 341/178; 332/112
(58) Field of Search ..................... 347/237, 239, 347/247, 252; 178/66.1, 79; 358/530, 443, 447, 448, 485, 456; 382/176; 341/53, 152, 173, 178, 179, 180; 455/102, 130; 332/108, 112

(56) References Cited

U.S. PATENT DOCUMENTS

| | | | |
|---|---|---|---|
| 4,206,316 | * 6/1980 | Burnsweig et al. | 178/66.1 |
| 4,347,523 | 8/1982 | Ohara | 347/252 |
| 4,375,065 | 2/1983 | Ohara | 347/252 |
| 4,905,023 | 2/1990 | Suzuki | 347/252 |
| 4,965,672 | 10/1990 | Duke et al. | 358/298 |
| 5,184,226 | 2/1993 | Cianciosi | 358/296 |
| 5,387,985 | * 2/1995 | Loce et al. | 358/447 |
| 5,634,088 | * 5/1997 | Banton | 358/1.2 |
| 5,742,703 | * 4/1998 | Lin et al. | 382/176 |

\* cited by examiner

Primary Examiner—N. Le
Assistant Examiner—Hai C. Pham
(74) Attorney, Agent, or Firm—Oliff & Berridge, PLC

(57) ABSTRACT

Multiple pulse width and position modulation methods and systems use multiple pulse width and position modulation (PWPM) circuits driven from the same system clock and video data to provide multiple video pulses per clock period. The multiple pulse width and position modulation methods and systems separately provide extremely fine halftone structures from n-bit per pixel video data words. The halftone structures can be provided without the need for extremely high resolution raster output scanners, associated optics and high speed electronics. The multiple pulse width and position modulation system (PWPM) can produce video pulses of variable width and position within a pixel period with extremely high addressability. The pulses output from multiple, independent pulse width and position modulation (PWPM) channels can be combined to form structured multiple video pulse patterns within the video clock or pixel period from a given n bit video data word. The multiple pulse width and position modulation methods and systems can be used with cathode ray tubes (CRT), laser printers, LED BAR printhead systems, an ink jet head with an ink jet printer, a microwave transmission apparatus, data transcription devices or data encryption devices.

28 Claims, 6 Drawing Sheets

MULTIPLE-PULSE, PULSE WIDTH AND POSITION MODULATION SYSTEMS AND METHODS

BACKGROUND OF THE INVENTION

1. Field of Invention

This invention relates generally to a digital pulse modulator. More particularly, this invention is directed to methods and systems that use multiple pulse width and position modulation (PWPM) circuits driven from the same system clock and video data to provide multiple video pulses per clock period.

2. Description of Related Art

In a system that uses one or more beams to record information, for example, on a photoreceptor, a digital pulse forming circuit may be used to control the one or more beams. Each beam may vary in intensity and duration according to the pulses used to control that beam.

One or more laser beams may be used in a printer or photocopier, for example, for discharging negative image areas on a photoreceptor. The latent electrostatic image formed on the photoreceptor by the one or more beams attracts developing toner in proportion to the latent image charge level in order to develop the image.

As another example, a cathode ray tube uses an electron beam to scan a phosphorus screen. The electron beam may be varied in intensity and duration to accurately display information on the phosphorous screen.

In both examples, a pulse forming circuit may be used to generate pulses to control the intensity and operation duration of the respective beams. In a high speed image forming system, the reset time of a pulse forming circuit is the time needed for the pulse forming circuit to reset to an initial state before a new pulse can be generated. Thus, the speed of a pulse forming circuit is limited by the amount of time it takes the circuit to form a pulse and reset to its initial state. U.S. Pat. Nos. 4,965,675 to Duke et al., 4,905,023 to Suzuji, 4,375,065 to Ohara, and 4,347,523 to Ohara each describe pulse forming circuits, systems and/or methods.

U.S. Pat. No. 5,184,226 to Cianciosi, incorporated herein by reference in its entirety, describes a digital electronics system that generates pulses from a series of data words. The digital electronics system includes lookup tables to translate each data word into a pulse attribute word. Each pulse attribute word includes information to controllably form a corresponding pulse. The digital electronics system also includes one or more multiplexers that split the series of pulse attribute words, generated from the series of data words, into two channels.

The digital electronics system of the 226 patent further includes pulse forming circuits for each channel. Each pulse forming circuit receives the pulse attribute word from the corresponding channel. Each pulse forming circuit forms a pulse based on the received pulse attribute word. The digital electronics system of the 226 patent additionally includes control circuits that generate and output the pulses to the beam emitting devices. In particular, in the digital electronics system described in the 226 patent, a first pulse from a first pulse forming circuit is generated while a second pulse from a second pulse forming circuit is being formed.

SUMMARY OF THE INVENTION

This invention provides methods and systems that provide multiple pulses per clock period.

This invention separately provides methods and systems that use multiple pulse width and position modulation (PWPM) circuits driven from the same system clock and data signals.

This invention separately provides systems and methods for providing extremely fine halftone structures from n-bit per pixel image data words.

One exemplary embodiment of the multiple pulse width and position modulation systems and methods according to this invention includes two or more of the digital electronics systems described in the 226 patent. Each of these two or more digital electronic systems forms one pulse width and position modulation circuit that is able to output a single pulse that is highly accurately positioned within a pixel period and that has a highly accurate pulse width. The pulse output from the two or more digital electronic systems are combined to form a single signal having one or more pulses, where each pulse is highly positionable and each pulse has a highly accurate pulse width. It should be appreciated that any known or later developed pulse width and position modulation method and/or circuit may be used with the multiple pulse width and position modulation systems and methods of this invention.

In accordance with one aspect of the multiple pulse width and position modulation systems and methods of this invention, the halftone structures can be provided without needing extremely high resolution raster output scanners, associated optics and high speed electronics.

The multiple pulse width and position modulation systems and methods according to this invention can produce one or more pulses of variable width and position within a pixel period with extremely high addressability. According to the multiple pulse width and position modulation systems and methods of this invention, the pulses output from multiple, independent pulse width and position modulation channels are combined to form structured multiple pulse patterns within the clock or pixel period for a given n-bit data word.

These and other features and advantages of this invention are described in or are apparent from the following detailed description of the circuits, systems and methods according to this invention.

BRIEF DESCRIPTION OF THE DRAWINGS

Various exemplary embodiments of the multiple pulse width and position modulation systems and methods of this invention will be described in detail, with reference to the following figures, wherein.

DETAILED DESCRIPTION OF PREFERRED EMBODIMENTS

Figure 1:
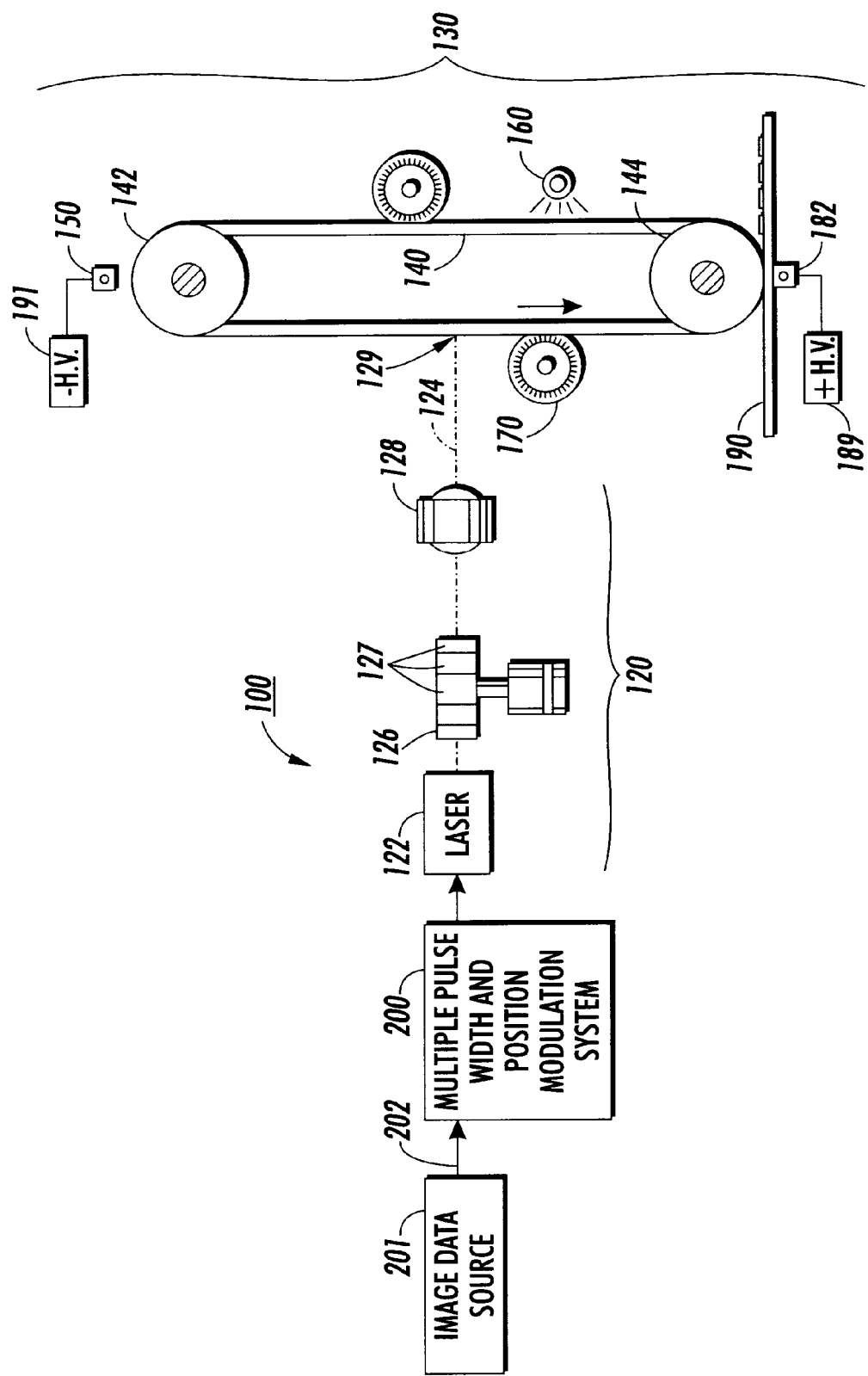
FIG. 1 shows an exemplary embodiment of a raster output scanner-type laser printer.

FIG. 1 shows an exemplary embodiment of a raster output scanner-type laser printer 100 that incorporates the multiple pulse width and position modulation system 200 according to this invention. As shown in FIG. 1, the laser printer 100 is connected to an image data source 201 that outputs a series of image data words representative of an image to be printed by the laser printer 100. The image data source 201 can be any known or later developed device or system capable of generating the image data words. The image data source 201 is connected to the laser printer 100 by a link 202. The link 202 can be any known or later developed device or system for transmitting the image data words to the laser printer 100.

The laser printer 100, in addition to the multiple pulse width and position modulation system 200, also includes a laser modulator subsystem 120 and an image forming subsystem 130. The laser modulator system 120 includes a laser modulator 122 that generates one or more modulated laser beams 124, a rotating polygon scanner 126 having a plurality of reflective facets 127 and an optics system 128 that focuses the one or more laser beams 124 onto a photoreceptor 140 of the image forming subsystem 130. The laser modulator 122 is connected to the multiple pulse width and position modulation system 200 by a signal line 110.

As shown in FIG. 1, one exemplary embodiment of the photoreceptor 140 is an endless belt stretched across a pair of drive and idler belt support rollers 142 and 144, respectively. Latent electrostatic images representative of the image defined by the image data words received from the image data source 201 are formed on the photoreceptor belt 140 by modulating the laser beam 124. The belt support rollers 142 and 144 are rotatably mounted in predetermined fixed positions. The support roller 144 is driven by a suitable drive motor to move the photoreceptor 140 in the direction shown by the solid line arrow. While the photoreceptor 140 is illustrated in the form of an endless belt, drum photoreceptors and any other known or later developed photoreceptor can be used with the multiple pulse width and position modulation systems and methods of this invention.

A corona charging device 150, commonly known as a corotron, is operatively disposed adjacent to the photoreceptor 140 at a charging station. The corotron 150, which is coupled to a suitable negative high voltage source 191, serves to place a uniform negative charge on the photoreceptor 140 in preparation for imaging.

The one or more laser beams 124 of the laser modulator subsystem 120 are incident on the photoreceptor 140 at an exposure point 129. The intensity and duration of each laser beam 124 is determined based on a corresponding pulse signal output by the multiple pulse width and position modulation system 200. The one or more laser beams 124 are swept across the photoreceptor 140 transverse to the indicated direction of motion by the rotating polygon mirror 126.

A development subsystem 170 is disposed in operative contact with the photoreceptor 140 downstream of the contact point 129 of the one or more laser beams 124. The development subsystem 170 preferably comprises a non-scavenging development system using a mono-component developer. The mono-component developer is preferably a relatively small colorant material, referred to as a toner. Due to electrostatic forces, the toner is drawn to the latent electrostatic image formed on the photoreceptor 140 in proportion to the charge level of the latent image to develop the image. In this exemplary embodiment, a discharge development system is used as the development subsystem 170.

Thus, following negative charging of the photoreceptor 140 by the corotron 150, image areas are discharged by the laser beam 124 in accordance with the pulse signals from the multiple pulse width and position modulation system 200. The developing toner is negatively charged and is therefore attracted to the discharged image areas while being repelled from the non-discharged areas. The development subsystem 170 includes a suitable developer housing (not shown) within which a supply of developer is provided together with any known or later developed device for supplying the developer to the photoreceptor 140. However, it should be appreciated that any other known or later developed development system could equivalently be used in place of this discharge development system.

In the discharge development subsystem 170, when the intensity of any particular laser beam 124 is at a maximum value, maximum development occurs and a fully black pixel is obtained. When that laser beam 124 is turned off, no development occurs and a white pixel is obtained. In the exemplary embodiment of the laser printer 100, multiple intermediate gray pixel levels are provided. These levels are obtained by providing intermediate intensity levels, so that corresponding intermediate amounts of development take place to provide predetermined light gray and dark gray pixels. The image data words received from the image data source 201 contain the information for controlling the beam intensity and duration.

Following development of the latent electrostatic image on the photoreceptor 140 by the developing subsystem 170, the developed image is transferred to a suitable copy or print substrate material 190, such as paper, at a transfer station. To facilitate transfer, a transfer corotron 182, which is coupled to a high voltage power source 189, is provided to attract the developed image from the photoreceptor 140 onto the copy substrate material 190. Following transfer, the developed image is fixed by fusing the toner onto the substrate 190. Any residual charges and/or developing material left on the photoreceptor 140 are removed at cleaning station by an erase lamp and cleaning brush 160.

While the laser printer 100 illustrated in FIG. 1 is a raster output scanner, any known or later developed image forming device, or any other known or later developed type of device that uses a modulated pulse to energize a beam or output element can be used with the multiple pulse width and position modulation system 200 according to this invention. Thus, the image forming device could be a digital photocopier, a liquid image development-type printer or photocopier, a full-width array type printer or photocopier, a pulse-driven ink jet printer of any type, or any other known or later developed pulse-driven image output device. It should also be appreciated that, in general, any known or later developed pulse-width modulated light emitting device can be used in place of the laser modulator 122. In particular, the light emitting device can include one or more of a laser, a semiconductor laser, a light emitting diode, an organic light emitting diode, or a laser diode.

Similarly, instead of an image output device, the pulse width and position modulation system 200 can be incorporated into any other known or later modulated-pulse-driven device, such as a cathode ray tube (CRT), light-emitting diode-type display, liquid crystal display, or the like.

Moreover, other pulse driven devices that can incorporate the pulse width and position modulation system 200 include acousto-optic modulators, which are commonly used to modulate helium-neon or other gas lasers. In particular, these devices use modulated radio frequency signals to modulate the laser beam output by the helium-neon or other gas lasers. In this system, the pulses output by the pulse width and position modulation system 200 would be used to modulate the radio frequency signals.

Similarly, other pulse driven devices that can incorporate the pulse width and position modulation system 200 include devices that modulate radio frequency signals for direct transmission or propagation as electromagnetic waves. For example, systems that generate coded transmissions of digital data can use the pulse width and position modulation system 200 to control pulses similar to the pulses that are used for radar etc.

Furthermore, any device where a precise pulse train is used to create a specialized analog pulse waveform can use the pulse width and position modulation system 200. For example, the pulse width and position modulation system 200 can be used to generate a pulse train input to a charge pump device, an integrator, or an electrical, optical or other known or later developed filter, to create a specialized analog waveform. One example waveform is a gaussian shaped pulse. The pulse width and position modulation system 200 can be used to control the pulse width and position relative to the time constants of a device like the charge pump, the integrator, or the filter to determine the shape of the output analog signal.

Finally, the pulse width and position modulation system 200 can be used in automatic test equipment to create precise pulses for testing and characterizing electronic devices and systems.

Figure 2:
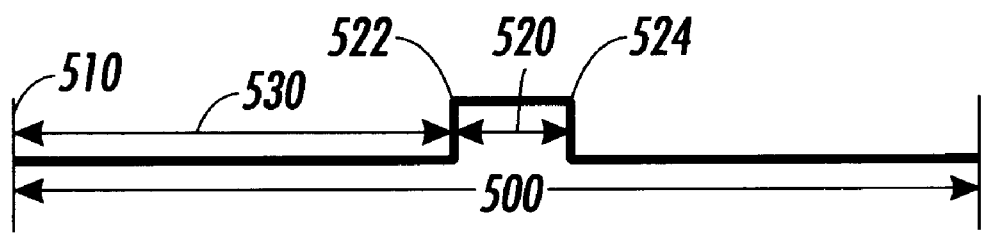
FIG. 2 illustrates an exemplary pulse with variable width, position, and amplitude.

FIG. 2 shows how a single pulse of a pulse signal output by the multiple pulse width and position modulation system 200 is generated based on an image data word. As shown in FIG. 2, the width and position of a pulse 520 within a pixel period 500 may be varied with separate, independently-variable, delays for the leading edge 522 and the trailing edge 524 of the pulse 500. A leading edge delay 530 is defined from the beginning 510 of the pixel period 500 to the leading edge 522 of the pulse 520. A trailing edge delay 540 is defined from the leading edge 522 of the pulse 520 to the trailing edge 524 of the pulse 520. Alternately, the trailing edge delay can be defined from the beginning 510 of the pixel period 500.

Figure 3:
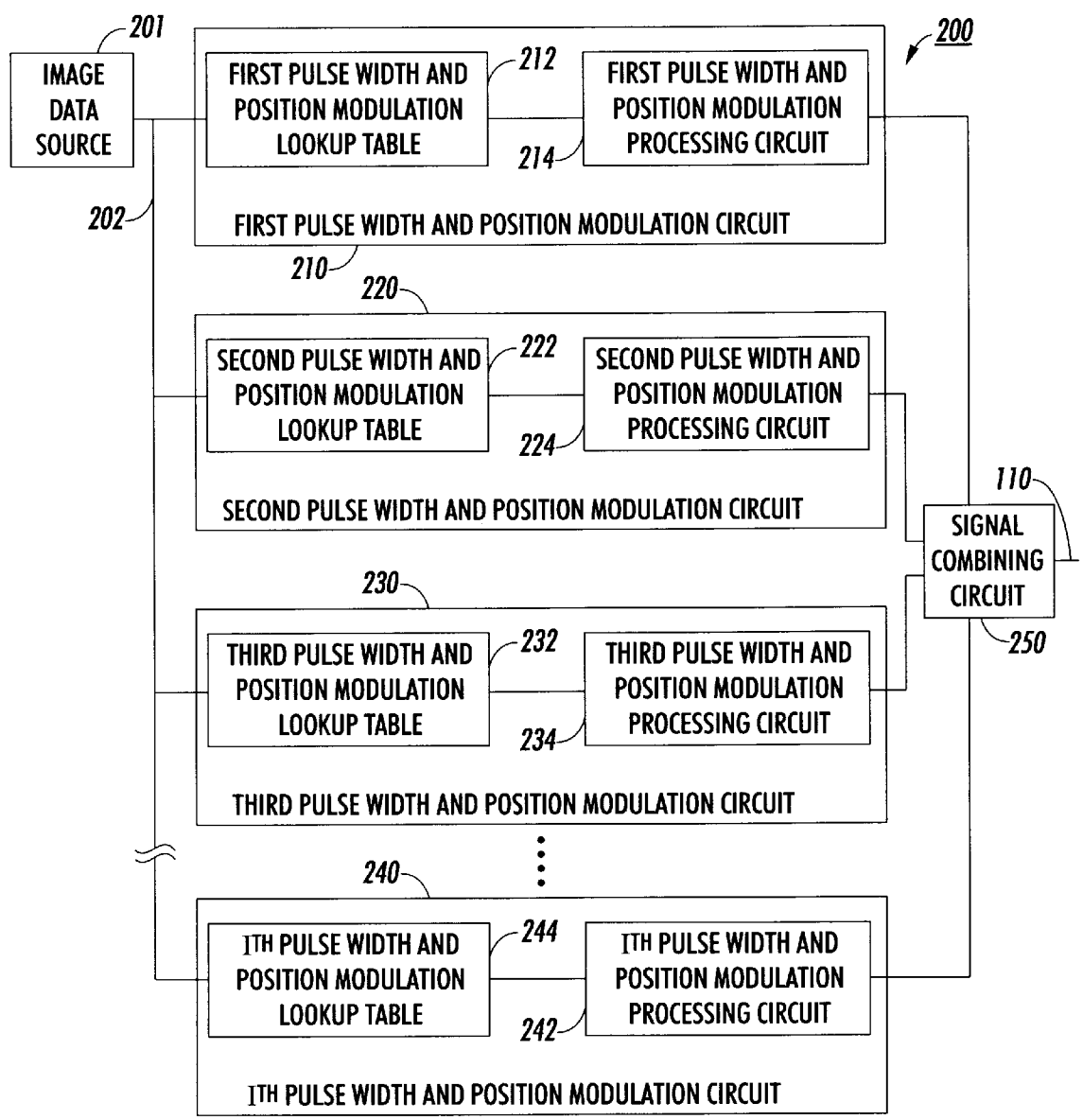
FIG. 3 is block circuit diagram of one exemplary embodiment of a multiple pulse width and position modulation system of FIG. 1 according to this invention.

FIG. 3 shows one exemplary embodiment of the multiple channeling of pulse width and position modulation system 200 according to this invention. As shown in FIG. 3, the pulse width and position modulation circuit includes a number i of individual pulse width and position modulation circuits 210–240. Each of the i pulse width and position modulation circuits 210–240 includes a pulse width and position modulation lookup table 212–242 and a pulse width and pulse modulation processing circuit 214–244. The i pulse width and position modulation circuits 210–240 are each connected to the image data source 201 to input over a data bus 205 the same image data word, as each image data word is received from the image data source 201 over the signal line 202.

Each image data word is an n-bit image data word. The n-bit image data words enter the i pulse width and position modulation (PWPM) lookup tables 212–242. Each data word represents an address within each of the lookup tables 212–242. Each of the i lookup tables 212–242 outputs a distinct data attribute from the address defined by the image data word that is input to all of the i lookup tables 212–242 at the same time. Each distinct data attribute word output from the i lookup tables 212–242 is input by the corresponding pulse width and position modulation processing circuit 214–244. Each of the i pulse width and position modulation processing circuits 214–244 converts the distinct data attribute word received from the corresponding pulse width and position modulation lookup table 212–242 into a distinct pulse signal having a pulse. That pulse has a defined pulse width and a defined position within the pixel period corresponding to the input image data word. The i distinct pulse signals generated by the i pulse width and position modulation processing circuits 214–244 are output over i signal lines 216–246 to a signal combining circuit 250.

As shown in FIG. 3, one exemplary embodiment of the signal combining circuit 250 is an i-input OR gate. However, any known or later developed device or circuit that is capable of combining the i distinct pulse signals output from the i pulse width and position modulation processing circuits 214–244 can also be used as the signal combining circuit 250. The signal combining circuit 250 combines the i distinct pulse signals into a single pulse signal having up to i distinct pulses. The single pulse signal is then output from the signal combining circuit 250 onto the signal line 110.

Figure 4:
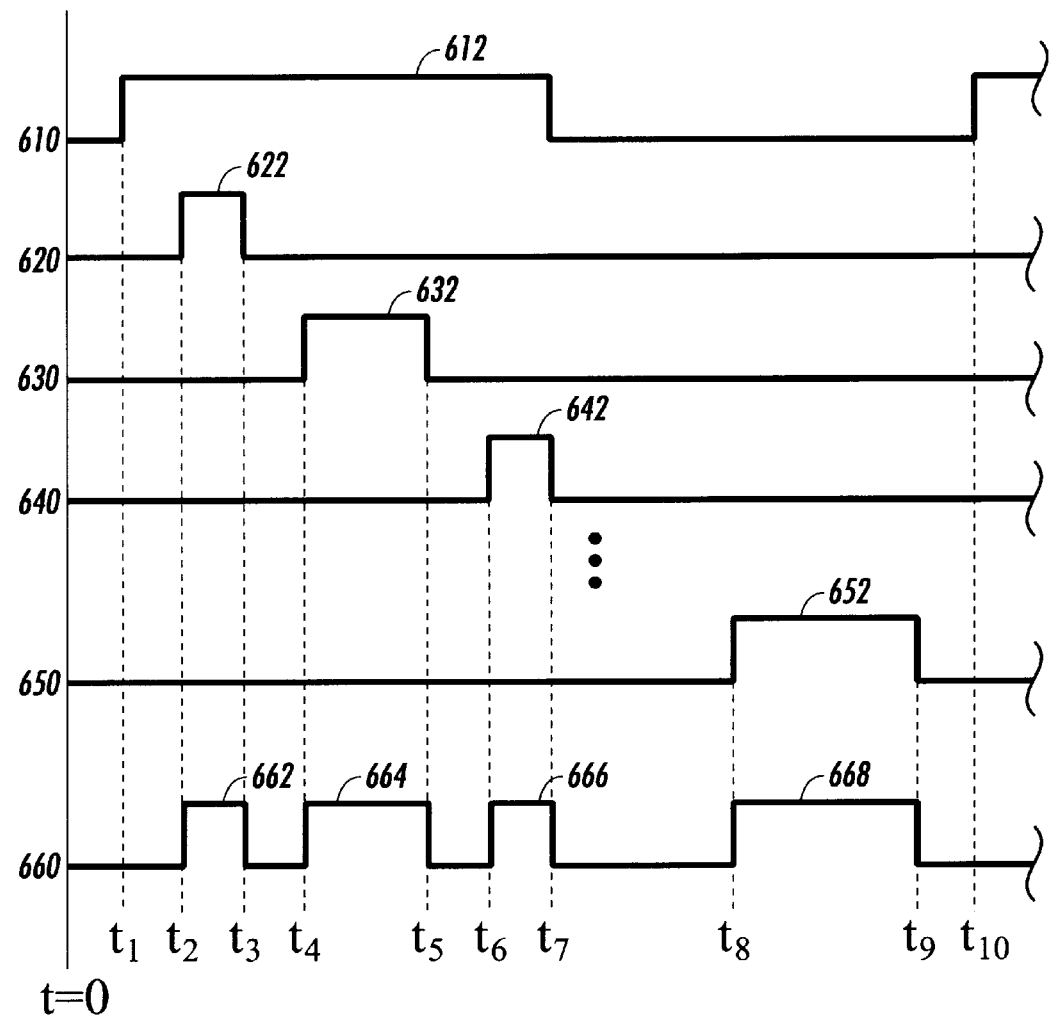
FIG. 4 is a schematic diagram showing multiple individual pulses and a combined pulse for a single clock period.

FIG. 4 shows a number of individual pulse width and position modulated signals 620–650 and the resulting composite multiple-pulse pulse width and position modulated signal 660 according to the multiple pulse width and position modulation systems and methods of this invention. As shown in FIG. 4, within each clock period 612 occurring in the clock signal 610, each of the i individual pulse width and position modulated signals 620–650 will contain at most one pulse 622–652, although none of the i signals 620–650 needs to have a pulse. That is, any particular signal 620–650 may have 0 pulses.

As shown in FIG. 4, a particular clock period 612 begins at time $t_1$, and extends until time $t_{10}$. Within this particular clock period 612, the pulse 622 occurring in the signal 620 extends from time $t_2$ to time $t_3$. Similarly, the pulse 632 in the signal 630 begins at time $t_4$ and continues until time $t_5$. The pulse 642 in the signal 640 occurs between times $t_6$ and $t_7$. Finally, shown in FIG. 4, the $i^{th}$ pulse 652 in the $i^{th}$ signal 650 occurs between times $t_8$ and $t_9$. Accordingly, when the pulses occurring in the clock period 612 in the i signals 620–650 are combined to form the composite signal 660, the composite signal 660 includes four pulses 662, 664, 666 and 668, corresponding to the four pulses 622, 632, 642 and 652, respectively. In particular, the pulse 662 occurs between times $t_2$ and $t_3$, while the pulse 664 occurs between times $t_4$ and $t_5$, the pulse 666 occurs between times $t_6$ and $t_7$, and the pulse 668 occurs between times $t_8$ and $t_9$.

Figure 5:
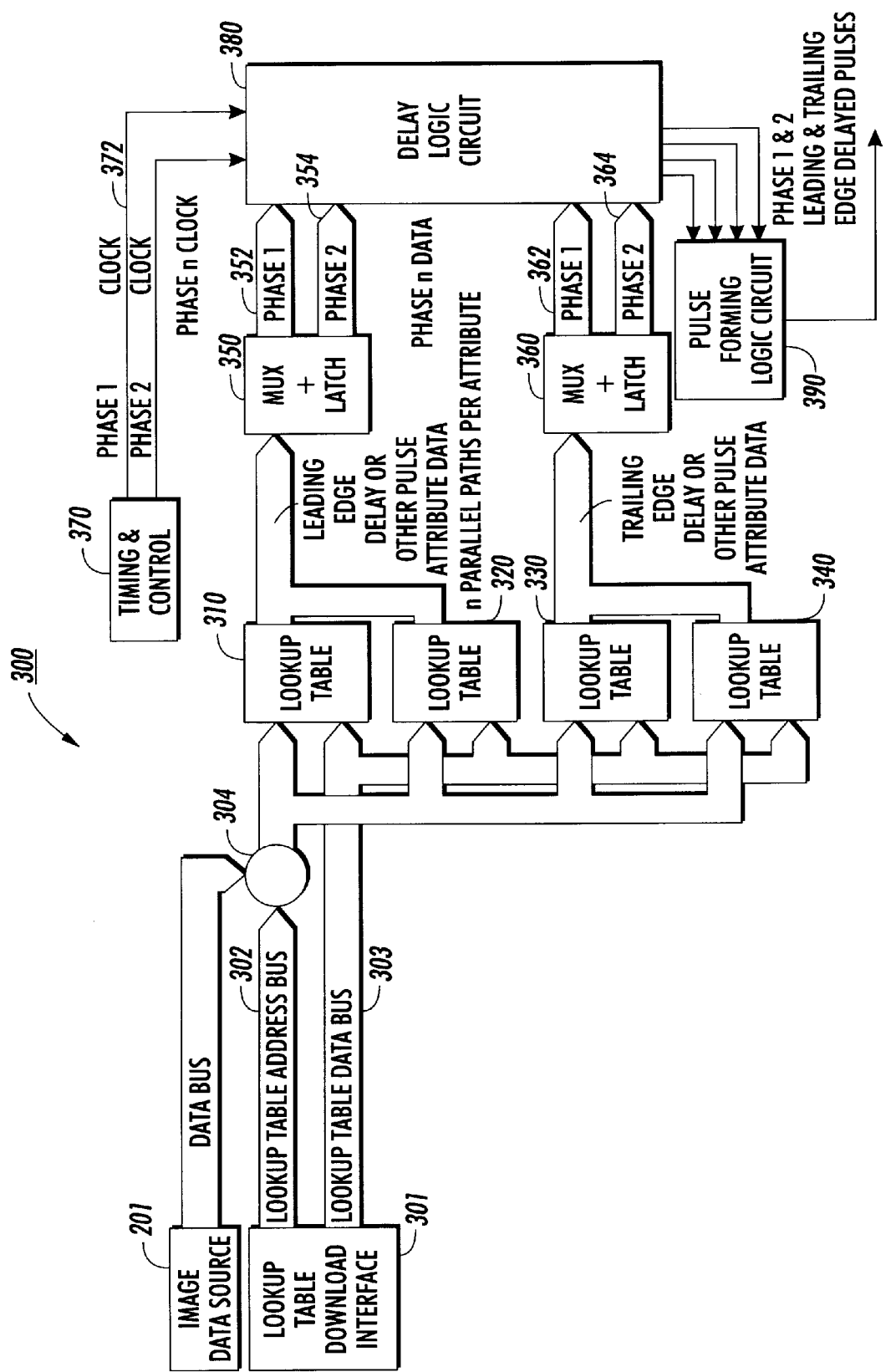
FIG. 5 is a block circuit diagram outlining one exemplary embodiment of the pulse width and position modulation circuit of FIG. 3 according to this invention.

FIG. 5 shows one exemplary embodiment of a pulse width and position modulator 300 used to form each of the i pulse width and position modulation circuits 210–240. As shown in FIG. 5, each pulse width and position modulator 300 inputs n-bit data words from the image data source 201. Each input data word is provided over a data bus 305 to a plurality of lookup tables 310, 320, 330, and 340 that together form one of the lookup tables 212, 222, 232 or 242.

The data bus 305 is connected to the lookup tables 310–340 through a lookup table data/image data multiplexer 304. Each data word represents an address within the four lookup tables 310, 320, 330, and 340. In this exemplary embodiment, two pairs of 256x4 ECL RAM memories are used to form the lookup tables 310–340. Each pair of lookup tables 310, and 320, or 330 and 340, is used to generate a pulse attribute word for each pulse attribute sought to be controlled. Pulse attributes may include leading edge delay, trailing edge delay, amplitude of the pulse to be formed, and other special features. Alternatively, a single 256x8 ECL RAM memory may be used in place of each pair of 256x8 ECL RAM memories. The exemplary embodiment of the pulse width and position modulator 300 shown in FIG. 5 includes two pairs of 256x4 RAM memories forming the lookup tables 310 and 320, and 330 and 340, respectively, corresponding to the two pulse attributes of leading edge delay and trailing edge delay to be generated for each phase. The pulse width and position modulator 300 will accommodate as many pairs of lookup tables as there are desired pulse attributes. For example, a third pair of lookup tables may be used to control the amplitude of a pulse to be formed.

Once an address in each lookup table 310–340 is accessed by the data word, each lookup table 310–340 generates a nibble (4 bits) of information. Thus, each pair of lookup tables 310 and 320, and 330 and 340, respectively, generates an 8-bit pulse attribute word corresponding to the pulse attribute sought to be controlled.

Characteristic data indicative of the pulse attributes sought to be controlled in a pulse width and position modulator 300 may be downloaded from the image data source 201 or another data source and stored into the lookup tables 310, 320, 330, and 340 through the lookup table download interface 301. By using a lookup table download interface 301 for the lookup tables 310, 320, 330, and 340, the pulse attributes can be changed by loading a new set of pulse attribute data into the lookup tables 310, 320, 330, and 340 before printing.

To load data into the lookup tables 310, 320, 330, and 340, the lookup table download interface 301 first instructs the lookup table data/image data multiplexer 304 to connect the lookup table address bus 302, instead of the data bus 305, to the lookup tables 310–340. In this way, the lookup table download interface 301 may designate the addresses that correspond to the memory locations in the lookup tables 310,320, 330, and 340 that are to be changed.

Once the lookup table download interface 301 accesses an address of one of the lookup tables 310–340, a pulse attribute data nibble may be loaded into that lookup table 310, 320, 330 or 340 through the lookup table data bus 303 from the lookup table download interface 301. This allows for different mapping functions to be provided in the pulse width and position modulator 300 for different printing characteristics, such as, for example, font smoothing, graphics, etc.. This further facilitates maintenance of print quality as the components of the system age. Thus, for example, the pulse characteristics can be changed as the photoreceptor 140 ages. After the lookup tables 310, 320, 330, and 340 are loaded, the lookup table download interface 301 instructs the lookup table data/image data multiplexer 304 to receive data from the data bus 305.

The four lookup tables 310, 320, 330, and 340 perform a logic mapping function, which translates the incoming data word into two pulse attribute words to control the formation of a pulse. The two lookup tables 310 and 320 generate separate nibbles of pulse attribute information which combine to form a pulse attribute word for the leading edge delay of a pulse to be formed. The two lookup tables 330 and 340 generate separate nibbles of pulse attribute information which combine to form a pulse attribute word for the trailing edge delay of a pulse to be formed.

Each pulse attribute word from the pairs of lookup tables 310–320 and 330–340 are input to one of the two multiplexer and latch blocks 350 and 360, respectively. Each multiplexer and latch block 350 and 360 contains two latches, one for each of the phase 1 buses 352, and 362, and the phase 2 buses 354 and 364. The two pulse attribute words generated in the pairs of lookup tables 310–320, and 330–340 from a data word are latched onto the phase 1 buses 352 and 362 by the respective multiplexers 350 and 360 at a leading edge of a pulse on the phase 1 clock signal output on a signal line 372 from the training and control circuit 370.

The two data words latched on the respective phase 1 buses 352 and 362 are further processed on separate channels of a delay logic circuit 380 and a pulse forming logic circuit 390. The delay logic circuit 380 forms separate leading and trailing edge delayed pulses. The pulse forming logic circuit 390 forms a single pulse from the leading and trailing edge delay pulses. The multiplexer and latch blocks 350 and 360, the timing and control circuit 370, the delay logic circuit 380 and the pulse forming circuit 390 together form one of the pulse width and position modulation processing circuits 214, 224, 234 or 244.

Figure 6:
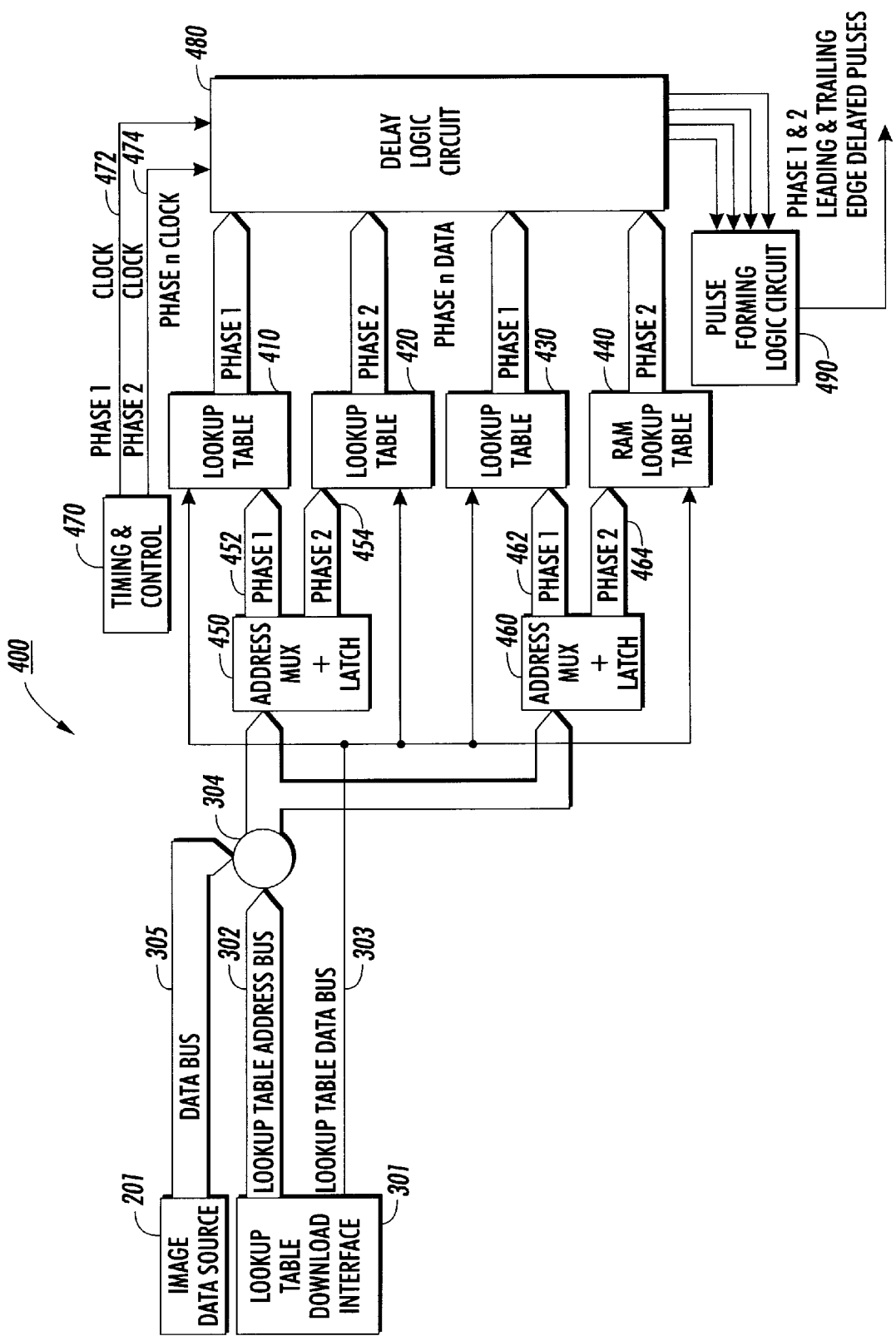
FIG. 6 is a block circuit diagram outlining another exemplary embodiment of the pulse width and position modulation circuit of FIG. 3 according to this invention.

FIG. 6 shows a second exemplary embodiment of a pulse width and position modulator 400 usable as one of the pulse width and position modulation circuits 210–240. As shown in FIG. 6, the pulse width and position modulator 400 is similar to the pulse width and position modulator 300, except that the data words are immediately channeled onto phased buses 452, 454, 462 and 464 before the data words are sent to the lookup tables 410, 420, 430, and 440.

The phasing of the data words in the pulse width and position modulator 400 operates in the same manner as in the pulse width and position modulator 300. In the pulse width and position modulator 400, four 256x8 ECL RAM lookup tables are used to form the lookup tables 410–440. Alternatively, 4 pairs of 256x4 ECL RAM lookup tables may be used. A first data word is phased onto the phase 1 buses 452 and 462 and sent to the phase 1 lookup tables 410 and 430 under control of the phase 1 clock signal output on a signal line 472 from the timing and control circuit 470.

Then, a next data word is phased by the address multiplexers and latches 450 and 460 onto the phase 2 buses 454 and 464 and sent to the phase 2 lookup tables 420 and 440 under control of the phase 2 clock signal output on the signal line 474. A data word addresses two pulse attribute words, one corresponding to each pulse attribute, from the phase 1 lookup tables 410 and 430. These two pulse attribute words are sent into the delay logic circuit 480, still under control of the phase 1 clock signal. Likewise, the second data word addresses two pulse attribute words from the phase 2 lookup tables 420 and 440. Those two pulse attribute words are sent into the delay logic circuit 480. Again, the pulse width and position modulator 400 may be expanded to accommodate a greater number of pulse attribute words and a greater number of phased routes into the lookup tables 410, 420, 430 and 440 and into the delay and pulse forming logic circuits 480 and 490.

Because the data words are channeled before the lookup tables 410, 420,430 and 440, slower lookup tables may be used. As in the case of separate phased channels going into the delay and pulse forming logic circuits 480 and 490, performance equivalent to that of faster, more expensive circuitry may be achieved with slower, less expensive lookup tables. The cost trade off may be balanced by the cost of fewer faster circuit components versus the cost of several slower circuit components. In the pulse width and position modulator 400, for example, twice as many RAM lookup tables are required to replace the lookup tables of the pulse width and position modulator 300. Similarly, in the delay and pulse forming circuits 480 and 490, and also in the delay and pulse forming logic blocks 380 and 390 of FIG. 5, twice as many delay and pulse forming circuits are required for two-phased processing, and three times as many delay and pulse forming circuits are required for three-phased processing, than are required for single-phased processing.

While this invention has been described in conjunction with the specific embodiments outlined above, it is evident that many alternatives, modifications and variations will be apparent to those skilled in the art. Accordingly, the preferred embodiments of the invention, as set forth above, are intended to be illustrative, not limiting. Various changes may be made without departing from the spirit and scope of the invention.

What is claimed is:

1. A multiple-pulse pulse width and position modulator that inputs a data signal, the data signal comprising a plurality of data portions, and that outputs a multiple-pulse pulse width and position modulated signal having a plurality of pulse periods, each pulse period corresponding to one of the data portions, the multiple-pulse pulse width and position modulated signal capable of having a plurality of independent pulse width and position modulated pulses occurring within each pulse period, the multiple-pulse pulse width and position modulator comprising:

a plurality of independent pulse width and position modulating circuits, each pulse width and position modulating circuit capable of generating a pulse width and position modulated pulse signal, the pulse width and position modulated pulse signal having, for each pulse period, at most a single pulse width and position modulated pulse that is based on a corresponding data portion; and a combining circuit that inputs each pulse width and position modulated pulse signal from the plurality of pulse width and position modulating circuits and outputs the multiple-pulse pulse width and position modulated signal.

2. The multiple-pulse pulse width and position modulator of claim 1, wherein:

each of the plurality of pulse width and position modulating circuits includes at least one lookup table; and the same data portion is input to each lookup table of each pulse width and position modulating circuit.

3. A light emitting apparatus, comprising:

at least one light emitting element; and the multiple-pulse pulse width and position modulator of claim 1;

wherein the at least one light emitting element is driven by the multiple-pulse pulse width and position modulated signal.

4. A raster output scanner comprising the light emitting apparatus of claim 3.

5. The light emitting apparatus of claim 3, wherein the light emitting element is a full-width printbar.

6. An image forming device comprising the light emitting apparatus of claim 3.

7. The image forming device of claim 6, wherein the image forming device is one of a laser printer, a photocopier, a liquid-image development-type photocopier, and a digital photocopier.

8. The light emitting apparatus of claim 3, wherein the light emitting element is at least one of a laser, a gas laser, a semiconductor laser, a light emitting diode, an organic light emitting diode, and a laser diode.

9. An ink jet printer, comprising:

at least ink ejecting element; and the multiple-pulse pulse width and position modulator of claim 1;

wherein the at least one ink ejecting element is driven by the multiple-pulse pulse width and position modulated signal.

10. A light emitting apparatus, comprising:

a light emitting element; and the multiple-pulse pulse width and position modulator of claim 1;

wherein the light emitting element is driven by the multiple-pulse pulse width and position modulated signal.

11. A raster output scanner comprising a plurality of the light emitting apparatus of claim 11.

12. The light emitting apparatus of claim 10, wherein the light emitting element is at least one of a laser, a semiconductor laser, a light emitting diode, an organic light emitting diode, and a laser diode.

13. An ink jet printer, comprising a plurality of ink ejecting devices, each ink ejecting device comprising:

an ink ejecting element; and the multiple-pulse pulse width and position modulator of claim 1;

wherein the ink ejecting element is driven by the multiple-pulse pulse width and position modulated signal.

14. The multiple-pulse pulse width and position modulator of claim 1, wherein the data signal is an image data signal.

15. An image forming apparatus, comprising:

at least one light emitting element; and the multiple-pulse pulse width and position modulator of claim 1;

wherein the at least one light emitting element is driven by the multiple-pulse pulse width and position modulated signal.

16. The image forming appartus of claim 15, wherein the image forming appartus is one of a laser printer, a photocopier, a liquid-image development-type photocopier, and a digital photocopier.

17. A display device comprising at least one of the image forming apparatus of claim 15.

18. The display device of claim 17, wherein the display device is one of a cathode ray tube-type display device, a light-emitting diode-type display device, and a liquid crystal display device.

19. A radio frequency signal generating apparatus, comprising:

a radio frequency signal generator that generates at least one radio frequency signal; and the multiple-pulse pulse width and position modulator of claim 1;

wherein the radio frequency signal generator is driven by the multiple-pulse pulse width and position modulated signal.

20. The radio frequency signal generating apparatus of claim 19, wherein the radio frequency signal generator includes an acousto-optical modulator.

21. A light emitting apparatus, comprising:

at least one light emitting element; and the radio frequency signal generating apparatus of claim 19;

wherein the at least one light emitting element is driven by the at least one radio frequency signal.

22. The light emitting apparatus of claim 21, wherein the at least one light emitting element is at least one gas laser.

23. A coded digital data signal transmitter, comprising:

a digital data signal coding system; and the radio frequency signal generating apparatus of claim 20;

wherein the digital data signal coding system is driven by the at least one radio frequency signal.

24. An analog pulse waveform generating apparatus, comprising:

an analog pulse waveform generator that generates an analog pulse waveform; and the multiple-pulse pulse width and position modulator of claim 1;

wherein the analog pulse waveform generator is driven by the multiple-pulse pulse width and position modulated signal.

25. The analog pulse waveform generating apparatus of claim 24, wherein the analog pulse waveform generator comprises a charge pump.

26. The analog pulse waveform generating apparatus of claim 24, wherein the analog pulse waveform generator comprises an integrator.

27. The analog pulse waveform generating apparatus of claim 24, wherein the analog pulse waveform generator comprises a filter.

28. A method for generating a pulse width and position modulation signal having a plurality of pulse periods, each pulse period capable of having a plurality of independent pulse width and position modulated pulses, the method comprising:

inputting a data signal comprising a plurality of data portions;

supplying, for each pulse period, a same one of the plurality of data portions to each of a plurality of independent pulse width and position modulation circuits;

outputting, from each of the plurality of pulse width and position modulation circuits, a pulse width and position modulated signal having at most one pulse width and position modulated pulse during each pulse period, wherein the at most one pulse width and position modulated pulse output during each pulse period in each pulse width and position modulated signal is based on the data portion supplied during that pulse period; and combining each pulse width and position modulated signal to form a single multiple-pulse pulse width and position modulated signal capable of having a plurality of independent pulse width and position modulated pulses during each pulse period.

* * * * *